United States Patent
Kuo et al.

(10) Patent No.: US 10,854,490 B2
(45) Date of Patent: Dec. 1, 2020

(54) WAFER CARRIER HANDLING APPARATUS AND METHOD THEREOF

(71) Applicant: TAIWAN SEMICONDUCTOR MANUFACTURING CO., LTD., Hsinchu (TW)

(72) Inventors: Tsung-Sheng Kuo, New Taipei (TW); Chih-Hung Huang, Hsinchu County (TW); Ming-Hsien Tsai, Taoyuan (TW); Yang-Ann Chu, Hsinchu (TW); Hsuan Lee, Tainan (TW); Jiun-Rong Pai, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/396,426

(22) Filed: Apr. 26, 2019

(65) Prior Publication Data

US 2020/0058535 A1 Feb. 20, 2020

Related U.S. Application Data

(60) Provisional application No. 62/718,942, filed on Aug. 14, 2018.

(51) Int. Cl.
*H01L 21/67* (2006.01)
*H01L 21/677* (2006.01)
*B65G 47/91* (2006.01)

(52) U.S. Cl.
CPC ........ *H01L 21/67766* (2013.01); *B65G 47/91* (2013.01); *H01L 21/67742* (2013.01); *H01L 21/67772* (2013.01)

(58) Field of Classification Search
CPC ........................ H01L 21/67772; H01L 21/673
See application file for complete search history.

(56) References Cited

U.S. PATENT DOCUMENTS

| | | | | |
|---|---|---|---|---|
| 5,895,191 A | * | 4/1999 | Bonora | H01L 21/67386 206/711 |
| 6,074,154 A | * | 6/2000 | Ueda | G03F 7/70691 414/217 |
| 6,120,371 A | * | 9/2000 | Roberson, Jr. | H01L 21/67772 454/187 |
| 6,435,330 B1 | * | 8/2002 | Bonora | H01L 21/67727 198/346.3 |
| 6,723,174 B2 | * | 4/2004 | Nelson | H01L 21/67769 134/33 |
| 2011/0031091 A1 | * | 2/2011 | Fatula, Jr. | B66C 1/663 198/463.3 |

* cited by examiner

*Primary Examiner* — Ronald P Jarrett
(74) *Attorney, Agent, or Firm* — Maschoff Brennan

(57) ABSTRACT

A wafer carrier handling apparatus includes a housing, a platform, a moving mechanism and a door storage device. The platform is configured to hold a wafer carrier. The moving mechanism is connected to the housing and configured to move the platform with respect to the housing. The door storage device is disposed above the housing. The door storage device has a first door storage zone. The first door storage zone is configured to allow a door of the wafer carrier to be held thereon.

20 Claims, 12 Drawing Sheets

WAFER CARRIER HANDLING APPARATUS AND METHOD THEREOF

PRIORITY CLAIM AND CROSS-REFERENCE

This application claims priority to U.S. Provisional Application Ser. No. 62/718,942, filed Aug. 14, 2018, which is herein incorporated by reference in its entirety.

BACKGROUND

Wafers are typically stored and transported together in batches by a wafer carrier throughout a semiconductor fabrication facility (also referred to as a "fab") between loadports of different wafer processing tools or equipment. Such tools generally perform various operations including photolithography, etching, material/film deposition, curing, annealing, inspection, or other processes used in integrated circuit (IC) chip manufacturing. The wafer carrier may be a wafer cassette or a wafer pod which is an enclosure designed to hold wafers of diameters ranging from about 300 mm to about 450 mm in a controlled environment. Typically, the wafers are stacked vertically in the wafer carrier.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
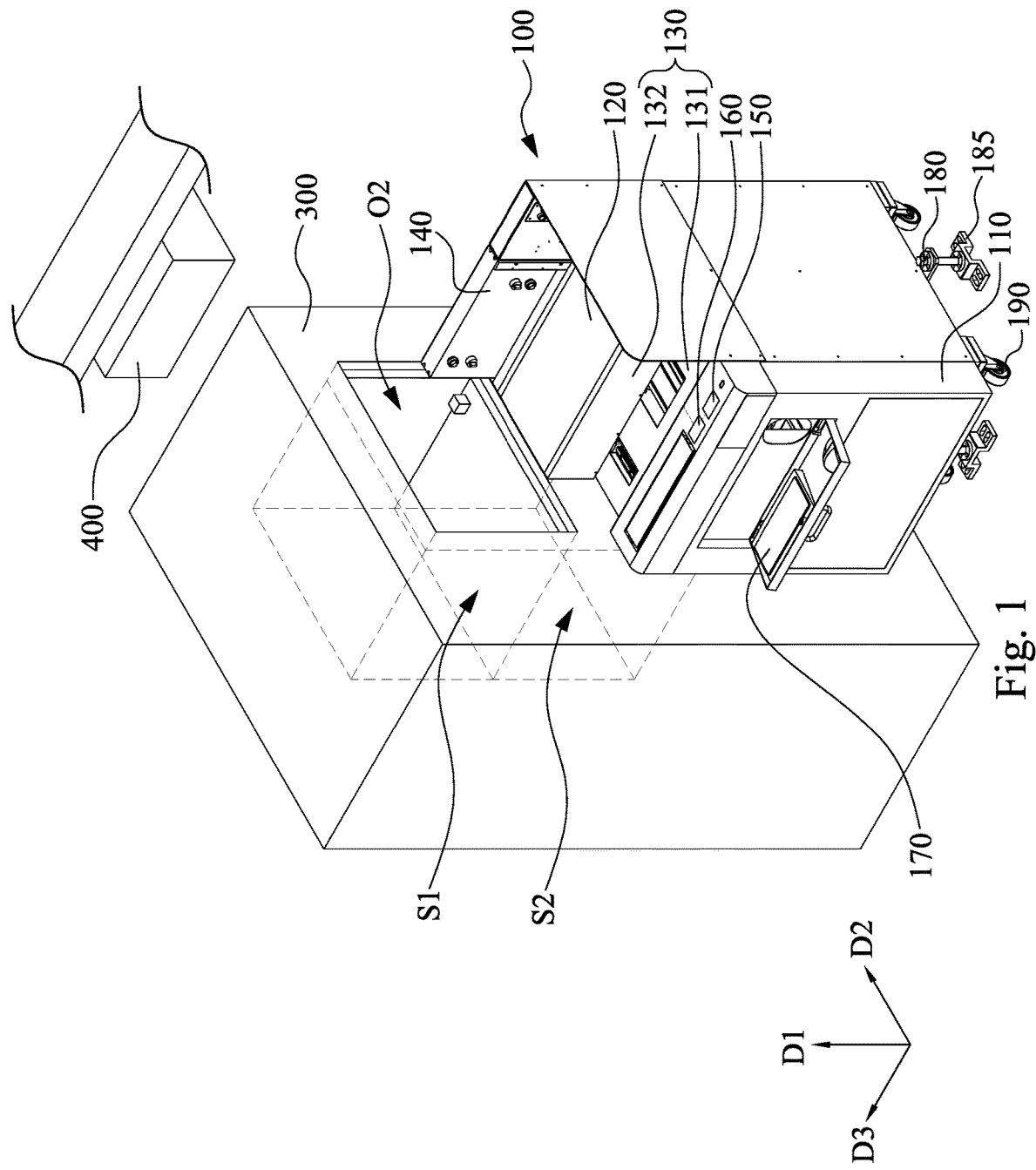
FIG. 1 is a schematic view of a wafer carrier handling apparatus in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Reference is made to FIG. 1. FIG. 1 is a schematic view of a wafer carrier handling apparatus 100 in accordance with some embodiments of the present disclosure. As shown in FIG. 1, the wafer carrier handling apparatus 100 is installed adjacent to at least one processing equipment 300. In addition, in some embodiments, the wafer carrier handling apparatus 100 is further located under a moving path of a delivery machine 400. In some embodiments, the delivery machine 400 can be an overhead hoist transport (OHT). In general, during the operation of the wafer carrier handling apparatus 100, the wafer carrier handling apparatus 100 receives, from the delivery machine 400 above, a wafer carrier 202 (not shown in FIG. 1, please see FIG. 2) fitted with a door 201. In some embodiments, the wafer carrier 202 may be a wafer pod, a wafer cassette, or the like. Subsequently, the wafer carrier handling apparatus 100 detaches and stores the door 201 away from the wafer carrier 202 and then moves the wafer carrier 202 without the door 201 into the processing equipment 300 for subsequent process. After the wafer carrier 202 has been processed in the processing equipment 300, the wafer carrier handling apparatus 100 takes the wafer carrier 202 without the door 201 out of the processing equipment 300 and then attaches the corresponding door 201 back to the wafer carrier 202. Afterwards, the delivery machine 400 secures and lifts the wafer carrier 202 with the attached door 201 away from the wafer carrier handling apparatus 100. The details of the operation as mentioned above are further described below.

Figure 2:
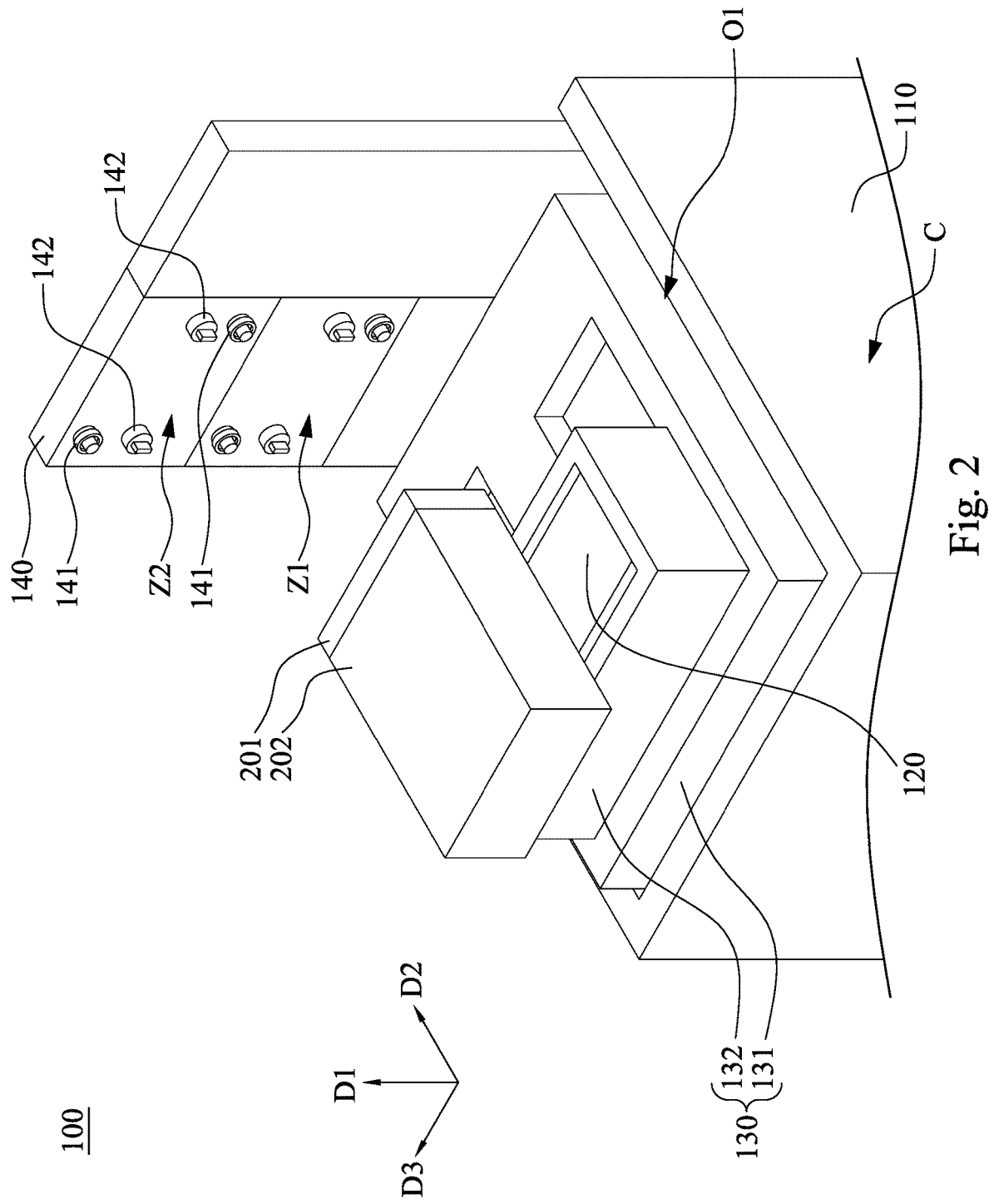
FIG. 2 is a partially magnified view of the wafer carrier handling apparatus of FIG. 1, in which a wafer carrier is held on a platform.

Reference is made to FIG. 2. FIG. 2 is a partially magnified view of the wafer carrier handling apparatus 100 of FIG. 1, in which the wafer carrier 202 with the door 201 is held on the platform 120. In some embodiments, as shown in FIG. 2, the wafer carrier handling apparatus 100 includes a housing 110, a platform 120, a moving mechanism 130 and a door storage device 140. The housing 110 is partially shown in FIG. 2. The housing 110 has a chamber C and an opening O1. The opening O1 is communicated with the chamber C. In some embodiments, the opening O1 is vertically above the chamber C of the housing 110. The platform 120 is configured to hold a wafer carrier 202. The wafer carrier 202 is placed and held on a top of the platform 120. The door 201 is detachably connected to the wafer carrier 202. The moving mechanism 130 is at least partially disposed within the chamber C. The moving mechanism 130 connected to the housing 110 and is configured to move the platform 120 with respect to the housing 110 at least along the first direction D1. The door storage device 140 is disposed on the housing 110 and is also outside the opening O1, such that the platform 120 is able to be moved adjacent to the door storage device 140 along the first direction D1. It is noted that the door storage device 140 has a plurality of door storage zones Z (will be further marked as Z1, Z2 below for detailed description). The door storage zones Z are arranged substantially along the first direction D1. That is, the platform 120 is able to be moved across the door storage zones Z along the first direction D1. At least one of the door storage zones Z is configured to allow at least one door 201 to be held thereon. In other words, a number of the doors 201 can be respectively stored at the door storage zones Z of the door storage device 140. For the sake of convenient detachment of the door 201 from the wafer carrier 202 and the subsequent storage of the door 201 by the door storage device 140, the wafer carrier 202 is placed and held on the top of the platform 120 with the door 201 facing to the door storage device 140.

Again, since the door storage device 140 has a plurality of door storage zones Z as mentioned above, the quantity of the door 201 that the wafer carrier handling apparatus 100 is able to store is thus also plural, i.e., more than one. As a result, the wafer carrier handling apparatus 100 is able to receive a plurality of wafer carriers 202 from the delivery machine 400 one by one, and successively move the wafer carriers 202 on which the corresponding doors 201 are removed into the processing equipment 300, while no extra work is required to remove the doors 201 away from the wafer carrier handling apparatus 100 and to store the doors throughout the operation. In this way, the process of successively moving the wafer carriers 202 without the doors 201 into the processing equipment 300 is made smooth, and thus the efficiency of the operation of the wafer carrier handling apparatus 100 is effectively enhanced.

Moreover, since no extra work or hand tool is applied to remove the doors 201 away from the wafer carrier handling apparatus 100 and store the doors 201 at the door storage device 140 throughout the operation, apart from saving man power, the chance of occurrence of human mistakes is also effectively avoided. In addition, a higher degree of a dust free environment in the vicinity is also increased.

In some embodiments, the moving mechanism 130 has three degree-of-freedom. As shown in FIG. 2, the moving mechanism 130 includes a first base 131 and a second base 132. The first base 131 is slidably connected to the housing 110 along the first direction D1 and is at least partially located within the chamber C. In other words, the first base 131 is able to be moved relative to the housing 110 along the first direction D1. On the other hand, the second base 132 is slidably connected to the first base 131 along a second direction D2. In other words, the second base 132 is able to be moved relative to the first base 131 along the second direction D2. In some embodiments, the second direction D2 is substantially orthogonal to the first direction D1 and is substantially perpendicular to the door storage zones Z of the door storage device 140. Furthermore, the platform 120 is slidably connected to the second base 132 along a third direction D3 such that the second base 132 is able to move the platform 120 along the third direction D3. In some embodiments, the third direction D3 is substantially orthogonal to the first direction D1 and the second direction D2. Structurally speaking, the second base 132 is at least partially disposed between the platform 120 and the first base 131.

In some embodiments, the movement of the platform 120 relative to the second base 132 along the third direction D3, the movement of the second base 132 relative to the first base 131 along the second direction D2, and the movement of the first base 131 relative to the housing 110 along the first direction D1 can be respectively carried out by electric motors and gear systems and guided by guiding rails, for example.

During the operation of the wafer carrier handling apparatus 100, as shown in FIG. 2, the wafer carrier 202 with the door 201 attached is first placed on the platform 120. At this point of time, the second base 132 is located away from the door storage device 140 along the second direction D2. As a result, the wafer carrier 202 with the door 201 attached is spaced apart from the door storage device 140 along the second direction D2 as well.

Afterwards, before the second base 132 of the moving mechanism 130 is moved close to the door storage device 140, the first base 131 of the moving mechanism 130 is first moved vertically along the first direction D1 relative to the housing 110, such that the elevation of the wafer carrier 202 matches the elevation of the corresponding door storage zone Z of the door storage device 140.

As shown in FIG. 2, for the sake of simplifying description, for example, the door storage device 140 includes two door storage zones Z1, Z2. However, it is noted that the quantity of the door storage zones Z of the door storage device 140 is only illustrative and can be increased or decreased in some embodiments. In this case as shown in FIG. 2, for example, the door storage zone Z2 is arranged vertically above the door storage zone Z1 along the first direction D1.

During the operation of the wafer carrier handling apparatus 100, as mentioned above, the first base 131 of the moving mechanism 130 is moved vertically along the first direction D1 relative to the housing 110, such that the elevation of the wafer carrier 202 matches the elevation of the door storage zone Z1, for example, of the door storage device 140. In some embodiments, according to the actual situation, the first base 131 of the moving mechanism 130 is moved vertically along the first direction D1 relative to the housing 110, such that the elevation of the wafer carrier 202 matches the elevation of the door storage zone Z2 instead.

Furthermore, as shown in FIG. 2, the door storage device 140 includes a plurality of mounting elements 141. The mounting elements 141 are arranged in each of the door storage zones Z1, Z2. The mounting elements 141 in each of the door storage zones Z1, Z2 are configured to hold the door 201 fitted on the wafer carrier 202. When the door 201 fitted on the wafer carrier 202 gets in touch with the mounting elements 141 on the door storage zone Z1, for example, the mounting elements 141 secures and holds the door 201 such that the door 201 does not move relative to the mounting elements 141 and is stored at the door storage zone Z1.

In some embodiments, the mounting elements 141 are suction heads. When the door 201 fitted on the wafer carrier 202 gets in touch with the suction heads, the suction heads secure and hold the door 201 by a suction force and the door 201 does not move relative to the suction heads. In some embodiments, the suction heads are further connected to a vacuum pump (not shown). In this way, under the action of the vacuum pump, the suction force acting on the door 201 by the suction heads is effectively increased such that the door 201 can be secured and held by the suction heads more firmly. However, it is noted that the type of the mounting elements 141 as suction heads is only illustrative and the mounting elements 141 can be other suitable mounting elements.

In addition, as shown in FIG. 2, the door storage device 140 includes a plurality of unlocking elements 142. The unlocking elements 142 are arranged in each of the door storage zones Z1, Z2. The unlocking elements 142 in each of the door storage zones Z1, Z2 are configured to release the door 201 from the wafer carrier 202. After the door 201 is secured and held firmly by the mounting elements 141 on the door storage zone Z1, for example, the unlocking elements 142 then release the door 201 from the wafer carrier 202 such that the door 201 and the wafer carrier 202 are detached from each other.

In some embodiments, the unlocking elements 142 are male portions. When the wafer carrier 202 fitted with the door 201 gets close to the door storage device 140, the male portions are inserted into the key holes (not shown) disposed on the door 201. After the door 201 is secured and held firmly by the mounting elements 141 on the door storage zone Z1 as mentioned above, the male portions are turned and the door 201 is released from the wafer carrier 202. However, it is noted that the type of the unlocking elements 142 as male portions is only illustrative and the unlocking elements 142 can be other suitable unlocking elements.

In some embodiments, as shown in FIG. 1, the wafer carrier handling apparatus 100 further includes a transceiver 150. The transceiver 150 is disposed on the housing 110. The transceiver 150 is configured to signally communicate with the delivery machine 400. For instance, when the platform 120 is occupied by the wafer carrier 202, regardless of if the door 201 is still attached on or already detached from the wafer carrier 202, the transceiver 150 emits a negative signal to the delivery machine 400 that the wafer carrier handling apparatus 100 refuses to receive another wafer carrier 202' (please see FIG. 8) from the delivery machine 400. On the contrary, when the platform 120 is empty and is ready for another wafer carrier 202' to be placed thereon, the transceiver 150 then emits a positive signal to the delivery machine 400 that the wafer carrier handling apparatus 100 is ready to receive another wafer carrier 202' from the delivery machine 400. After the delivery machine 400 receives the positive signal, the delivery machine 400 moves and places the wafer carrier 202' on the platform 120 of the wafer carrier handling apparatus 100.

Moreover, as shown in FIG. 1, the wafer carrier handling apparatus 100 further includes a processor 160. In some embodiments, the processor 160 is electrically connected to the transceiver 150 and the moving mechanism 130. In more detail, before the delivery machine 400 moves and places the wafer carrier 202 on the platform 120 of the wafer carrier handling apparatus 100, the delivery machine 400 emits an operational signal to the transceiver 150 of the wafer carrier handling apparatus 100. The processor 160 is configured to process the operational signal to control the moving mechanism 130. Accordingly, when the delivery machine 400 moves and places the wafer carrier 202 on the platform 120 of the wafer carrier handling apparatus 100, the processor 160 controls the moving mechanism 130 to move the second base 132 along the second direction D2 and move the platform 120 along the third direction D3 such that the platform 120 is finely adjusted in order to reach a position at which the wafer carrier 202 can be received by the platform 120 properly.

Furthermore, provided that the elevation of the opening O2 of the processing equipment 300 is input to the processor 160 in advance, the processor 160 also drives the first base 131 of the moving mechanism 130 to move vertically along the first direction D1, such that the elevation of the wafer carrier 202 held on the platform 120 matches the opening O2 and the wafer carrier 202 can thus be moved into the processing equipment 300 through the opening O2 properly.

Since the operation of the wafer carrier handling apparatus 100 can be controlled by the processor 160 in a mutual communication with the delivery machine 400 as mentioned above, the operation of the wafer carrier handling apparatus 100 and the delivery machine 400 can be configured by a computer program. Therefore, apart from a saving of man power, the chance of occurrence of human mistake is also effectively avoided.

In some embodiments, the wafer carrier handling apparatus 100 further includes an input device 170. The input device 170 is disposed at the housing 110 and is configured to manually control the processor 160. In other words, the moving mechanism 130 can be manually controlled such that the platform 120 can be moved along the first direction D1, the second direction D2 and the third direction D3 according to the actual situations. In some embodiments, for example, the input device 170 can be a combination of a monitor, a keyboard and a mouse or other suitable input device.

Figure 3:
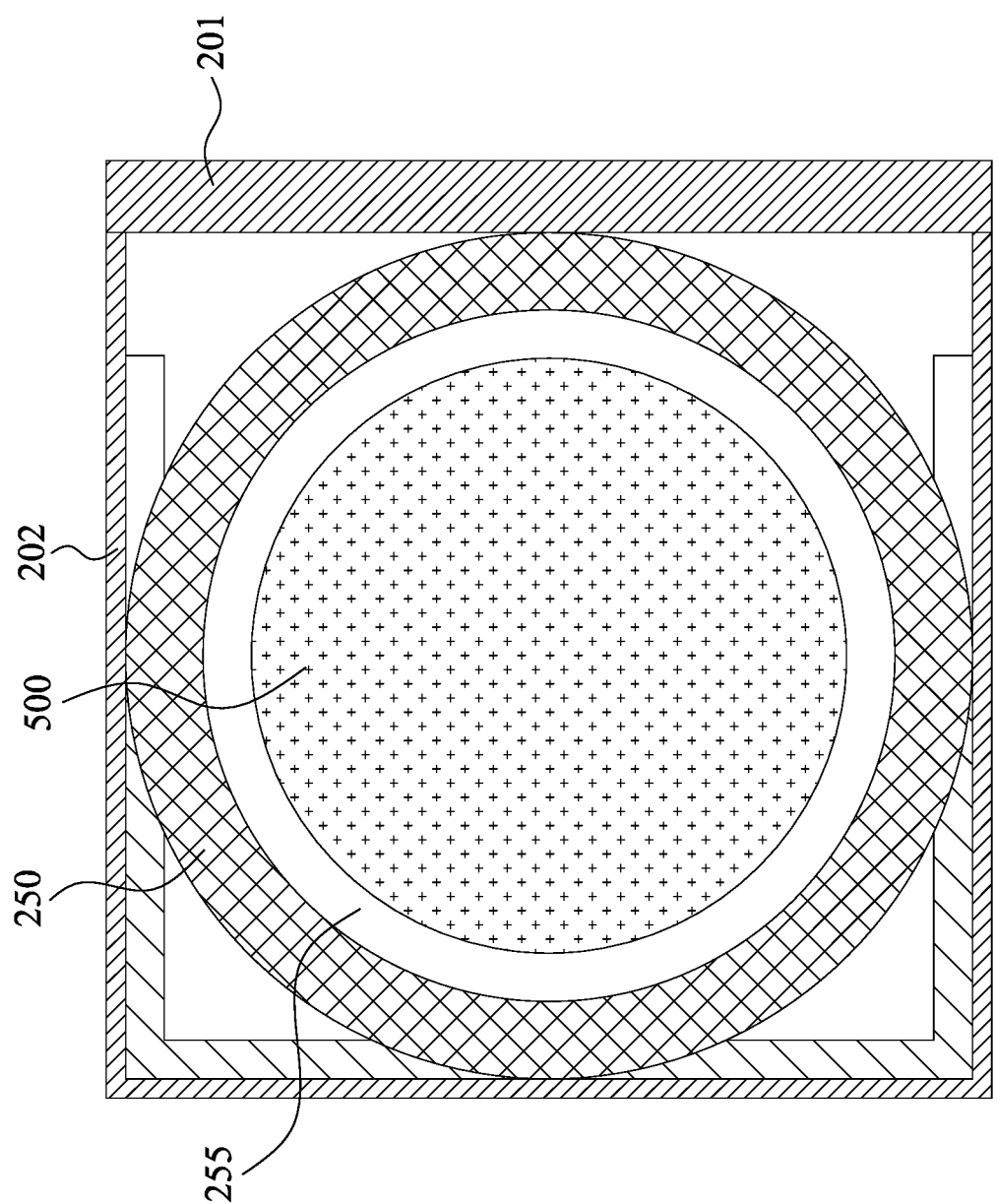
FIG. 3 is a cross-sectional top view of the wafer carrier of FIG. 2.

Moreover, in some embodiments, the operational signal emitted by the delivery machine 400 also includes an information about a quantity of frames or wafers disposed inside the wafer carrier 202 that is to be placed on the platform 120. Please refer to FIG. 3. FIG. 3 is a cross-sectional top view of the wafer carrier 202 of FIG. 2. As shown in FIG. 3, a frame 250 is disposed in the wafer carrier 202, and a wafer 500 is placed on a film 255 stretched over the frame 250. It is noted that only one of the frames 250 and one of the wafers 500 are shown in FIG. 3 because the rest of the frames 250 and the rest of the wafers 500 are located below and blocked by the frame 250 and the wafer 500 located on the top. The processor 160 of the wafer carrier handling apparatus 100 accordingly records the information about the quantity of the frames 250 or the wafers 500 disposed inside the wafer carrier 202 by using the operational signal received by the transceiver 150. Therefore, the maximum number of wafers 500 allowed to be delivered into the processing equipment 300 is under control.

Figure 4:
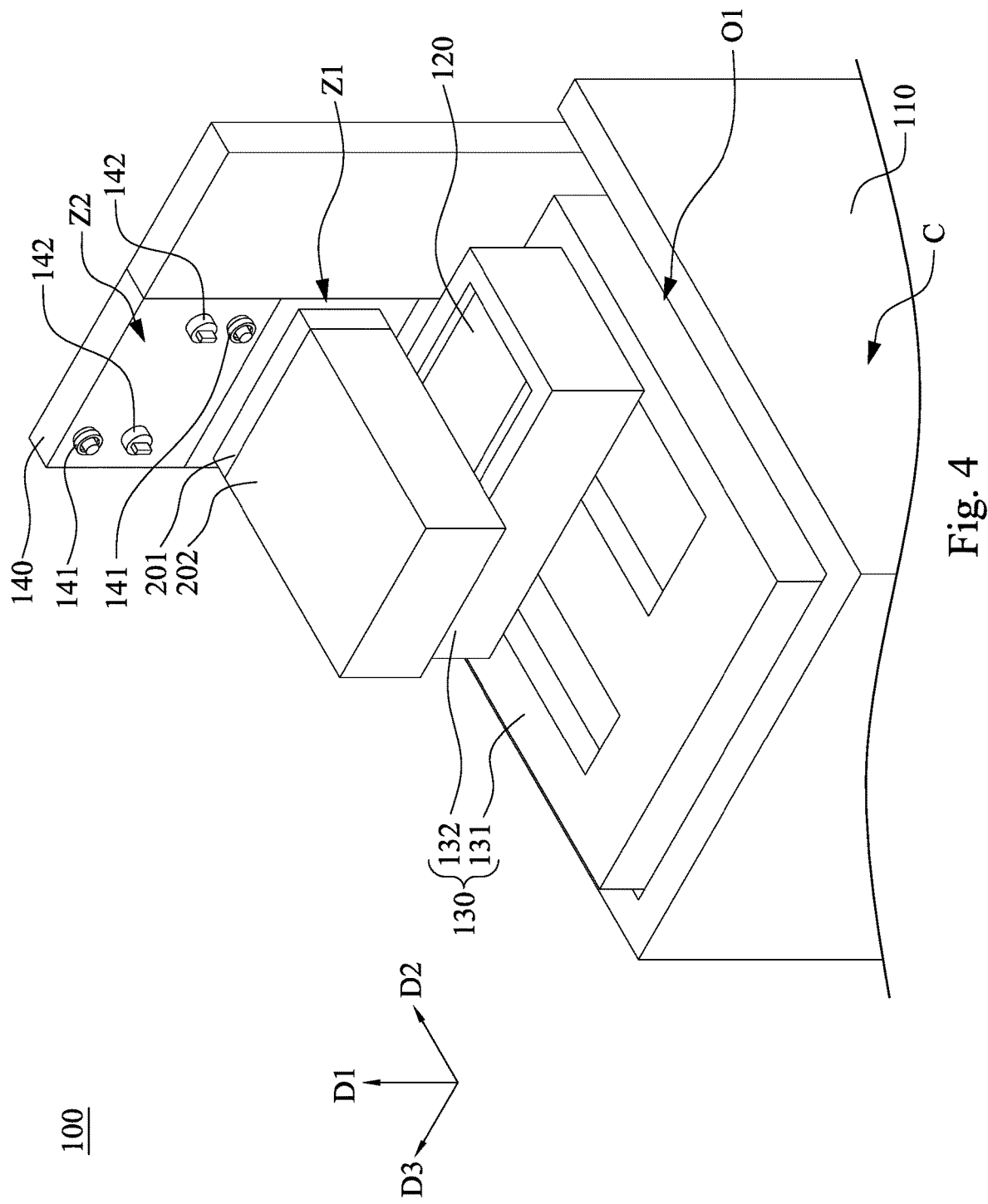
FIG. 4 is a partially magnified view of the wafer carrier handling apparatus of FIG. 1, in which the platform is moved close to a door storage device.

Reference is made to FIG. 4. FIG. 4 is a partially magnified view of the wafer carrier handling apparatus 100 of FIG. 1, in which the platform 120 is moved close to the door storage device 140. In some embodiments, as shown in FIG. 4, after the elevation of the wafer carrier 202 matches the door storage zone Z1 of the door storage device 140, the second base 132 of the moving mechanism 130 is moved close to the door storage device 140 such that the platform 120 connected above the second base 132 is moved close to the door storage device 140 as well. Since the elevation of the wafer carrier 202 already matches the door storage zone Z1, for example, of the door storage device 140, the door 201 facing the door storage device 140 gets in contact with the door storage zone Z1. As mentioned above, the mounting elements 141 on the door storage zone Z1 then firmly secure and hold the door 201 and the unlocking elements 142 on the door storage zone Z1 release the door 201 from the wafer carrier 202 such that the door 201 and the wafer carrier 202 are detached from each other.

Figure 5:
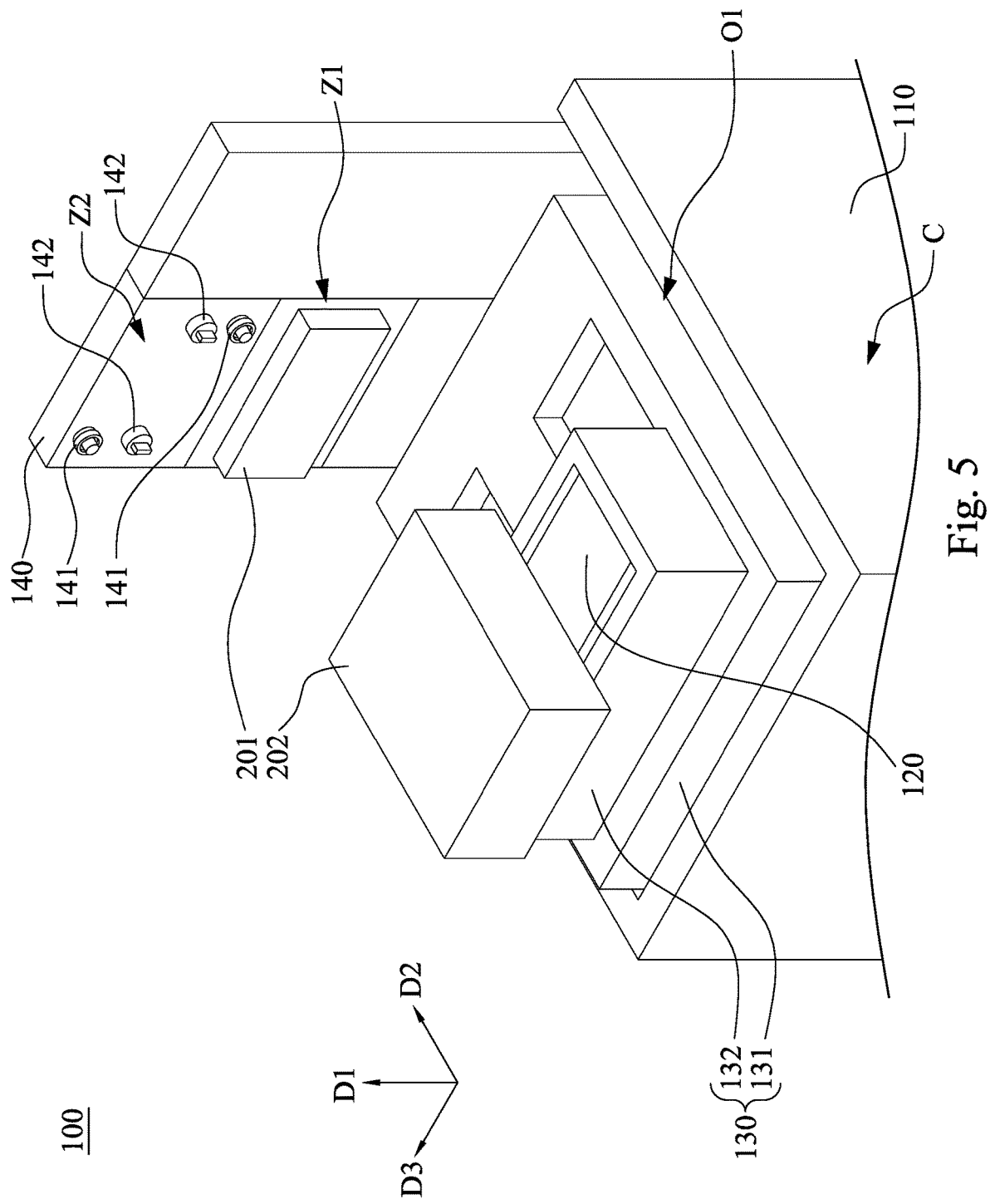
FIG. 5 is a partially magnified view of the wafer carrier handling apparatus of FIG. 1, in which a door is stored at the door storage device.

Reference is made to FIG. 5. FIG. 5 is a partially magnified view of the wafer carrier handling apparatus 100 of FIG. 1, in which the door 201 is stored at the door storage device 140. In some embodiments, as shown in FIG. 5, after the door 201 and the wafer carrier 202 are detached from each other, the second base 132 of the moving mechanism 130 is moved away from the door storage device 140 along the second direction D2. As a result, the platform 120 and thus the wafer carrier 202 is moved away from the door storage device 140 along the second direction D2, leaving the door 201 stored at the door storage zone Z1 of the door storage device 140.

Figure 6:
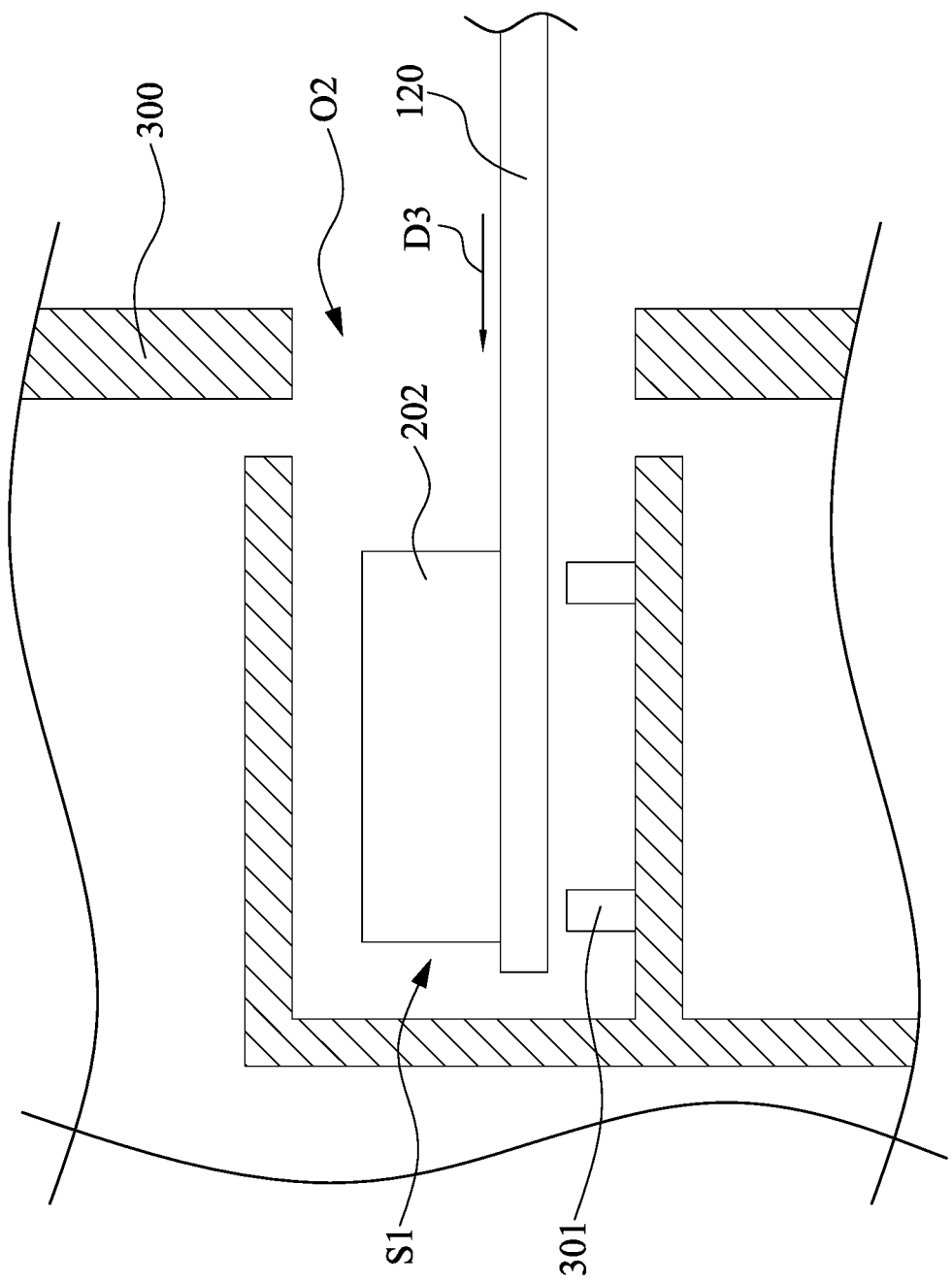
FIG. 6 is a partially magnified cross-sectional view of the wafer carrier handling apparatus of FIG. 1, in which the platform moves the wafer carrier into the processing equipment.

Reference is made to both FIG. 1 and FIG. 6. FIG. 6 is a partially magnified cross-sectional view of the wafer carrier handling apparatus 100 of FIG. 1, in which the platform 120 moves the wafer carrier 202 into the processing equipment 300. In some embodiments, as shown in FIG. 1 and FIG. 6, after the wafer carrier 202 is moved with the platform 120 away from the door storage device 140 along the second direction D2, the second base 132 is moved vertically along the first direction D1 such that the elevation of the wafer carrier 202 matches the opening O2 of the processing equipment 300. After the elevation of the wafer carrier 202 matches the opening O2 of the processing equipment 300, the moving mechanism 130 moves the platform 120 to load the wafer carrier 202 into the processing equipment 300 through the opening O2.

In some embodiments, the processing equipment 300 has a first accommodation space S1 for accommodating the wafer carrier 202. Furthermore, the processing equipment 300 has a plurality of supporting stands 301 disposed inside the first accommodation space S1. The supporting stands 301 are used for supporting the wafer carrier 202. When the platform 120 and the wafer carrier 202 are moved into the processing equipment 300 through the opening O2, the wafer carrier 202 stops above the supporting stands 301.

Figure 7:
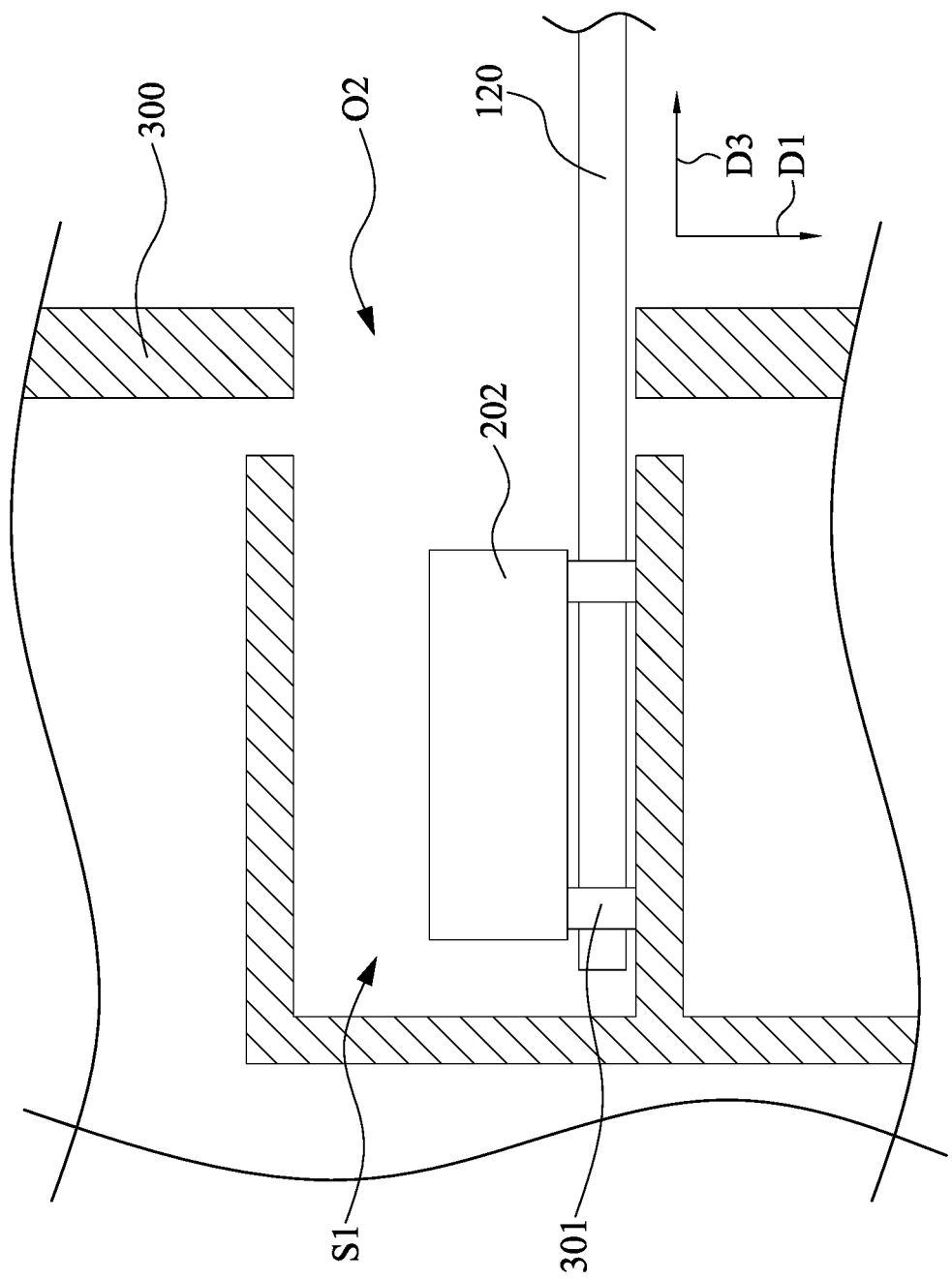
FIG. 7 is a partially magnified cross-sectional view of the wafer carrier handling apparatus of FIG. 1, in which the wafer carrier is placed into the processing equipment.

Reference is made to both FIG. 1 and FIG. 7. FIG. 7 is a partially magnified cross-sectional view of the wafer carrier handling apparatus 100 of FIG. 1, in which the wafer carrier 202 is placed into the processing equipment 300. In some embodiments, as shown in FIG. 1 and FIG. 7, after the wafer carrier 202 reaches an appropriate position, the first base 131 of the moving mechanism 130 is moved vertically downwards along the first direction D1 such that the wafer carrier 202 sits on the supporting stands 301 and the platform 120 is consequently separated from the wafer carrier 202. Afterwards, the platform 120 is moved away from the processing equipment 300 through the opening O2 along the third direction D3, leaving the wafer carrier 202 remaining inside the processing equipment 300.

After the working procedure as described above, the wafer carrier 202 is handled such that the door 201 is stored at the door storage zone Z1 of the door storage device 140 while the wafer carrier 202 is moved into the processing equipment 300. At this point of time, the platform 120 is empty and is ready for another wafer carrier 202' (please refer to FIG. 8) to be placed thereon, and the transceiver 150 of the wafer carrier handling apparatus 100 then emits a positive signal to the delivery machine 400 that the wafer carrier handling apparatus 100 is ready to receive another wafer carrier 202' from the delivery machine 400.

Figure 8:
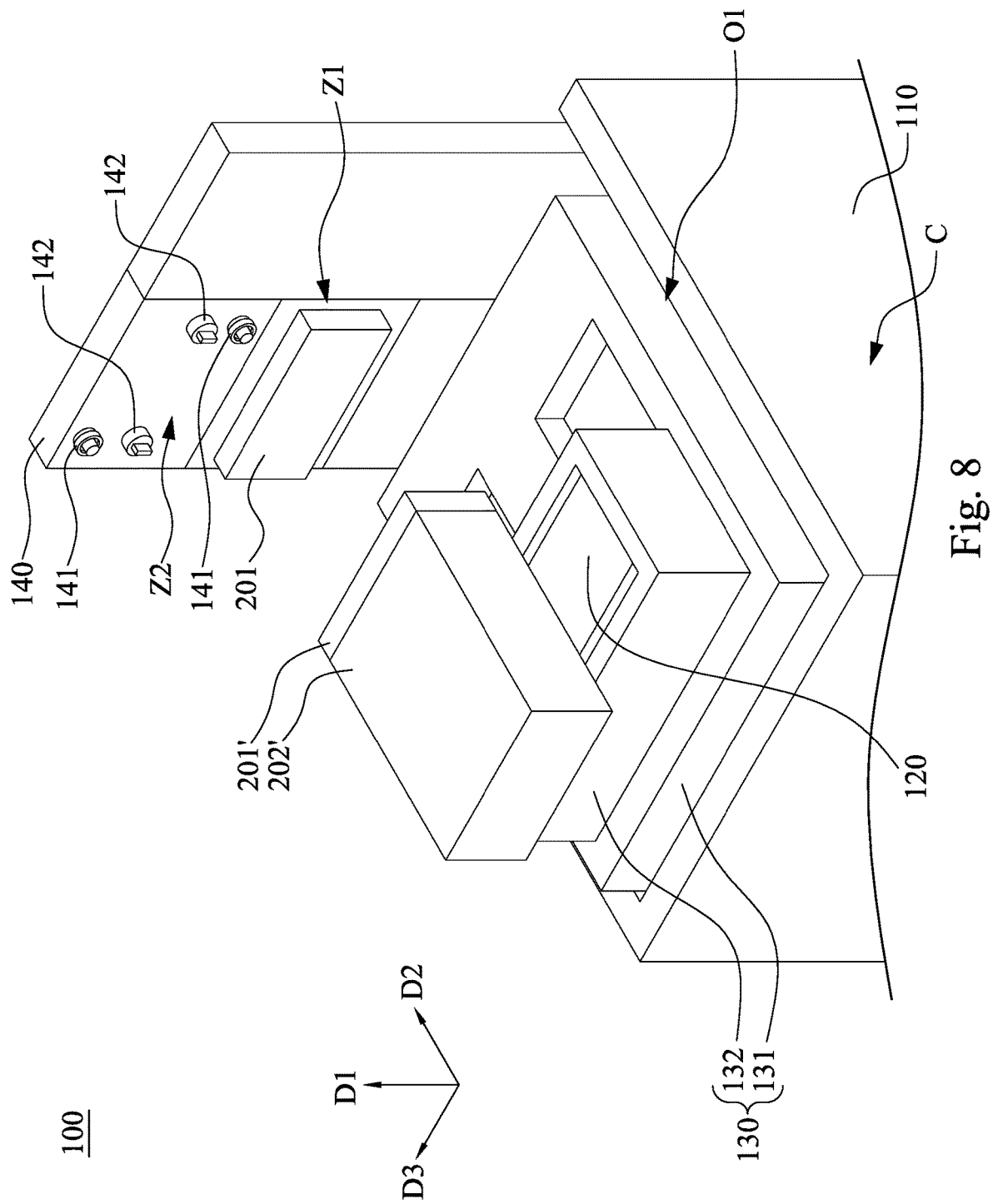
FIG. 8 is a partially magnified view of the wafer carrier handling apparatus of FIG. 1, in which another wafer carrier is held on the platform.

Reference is made to FIG. 8. FIG. 8 is a partially magnified view of the wafer carrier handling apparatus 100 of FIG. 1, in which another wafer carrier 202' is held on the platform 120. As mentioned above, after the delivery machine 400 receives the positive signal, the delivery machine 400 moves and places the wafer carrier 202' on the platform 120 of the wafer carrier handling apparatus 100. In some embodiments, as shown in FIG. 8, the wafer carrier 202' with the door 201' attached is placed on the platform 120. At this point of time, the second base 132 is located away from the door storage device 140 along the second direction D2. As a result, the wafer carrier 202' with the door 201' attached is spaced apart from the door storage device 140 along the second direction D2 as well.

Afterwards, before the second base 132 of the moving mechanism 130 is moved close to the door storage device 140, the first base 131 of the moving mechanism 130 is first moved vertically along the first direction D1 relative to the housing 110, such that the elevation of the wafer carrier 202' matches the door storage zone Z2 of the door storage device 140. Please be noted that the door storage zone Z1 of the door storage device 140 is already occupied by the door 201 from the last operation as described previously.

Figure 9:
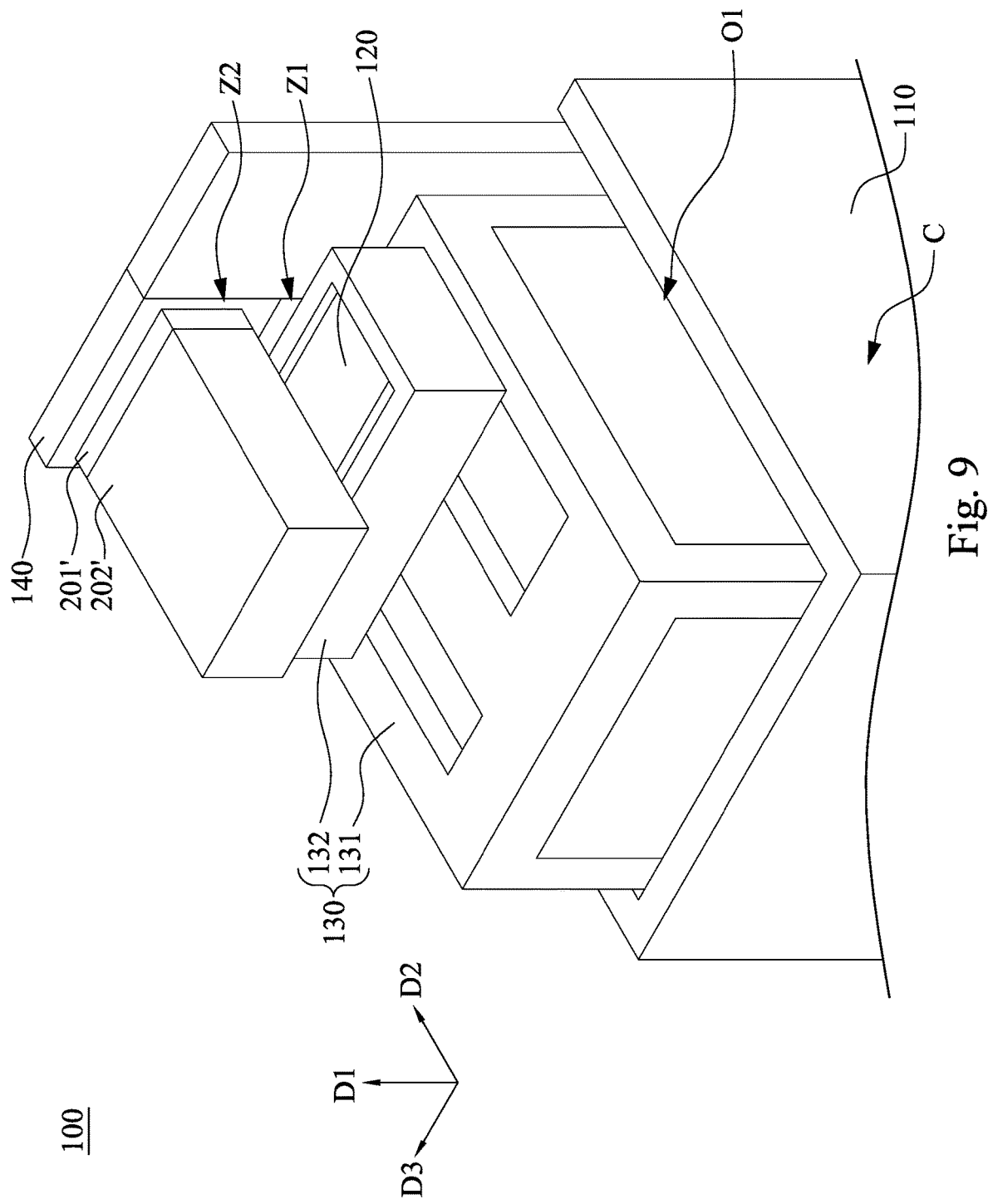
FIG. 9 is a partially magnified view of the wafer carrier handling apparatus of FIG. 1, in which the platform is moved close to the door storage device again.

Reference is made to FIG. 9. FIG. 9 is a partially magnified view of the wafer carrier handling apparatus 100 of FIG. 1, in which the platform 120 is moved close to the door storage device 140 again. In some embodiments, as shown in FIG. 9, after the elevation of the wafer carrier 202' matches the door storage zone Z2 of the door storage device 140, the second base 132 of the moving mechanism 130 is moved close to the door storage device 140 such that the platform 120 connected above the second base 132 is moved close to the door storage device 140 as well. Since the elevation of the wafer carrier 202' already matches the door storage zone Z2 of the door storage device 140, the door 201' facing the door storage device 140 gets in contact with the door storage zone Z2. Similarly as mentioned above, the mounting elements 141 on the door storage zone Z2 then firmly secure and hold the door 201' and the unlocking elements 142 on the door storage zone Z2 release the door 201' from the wafer carrier 202' such that the door 201' and the wafer carrier 202' are detached from each other.

Figure 10:
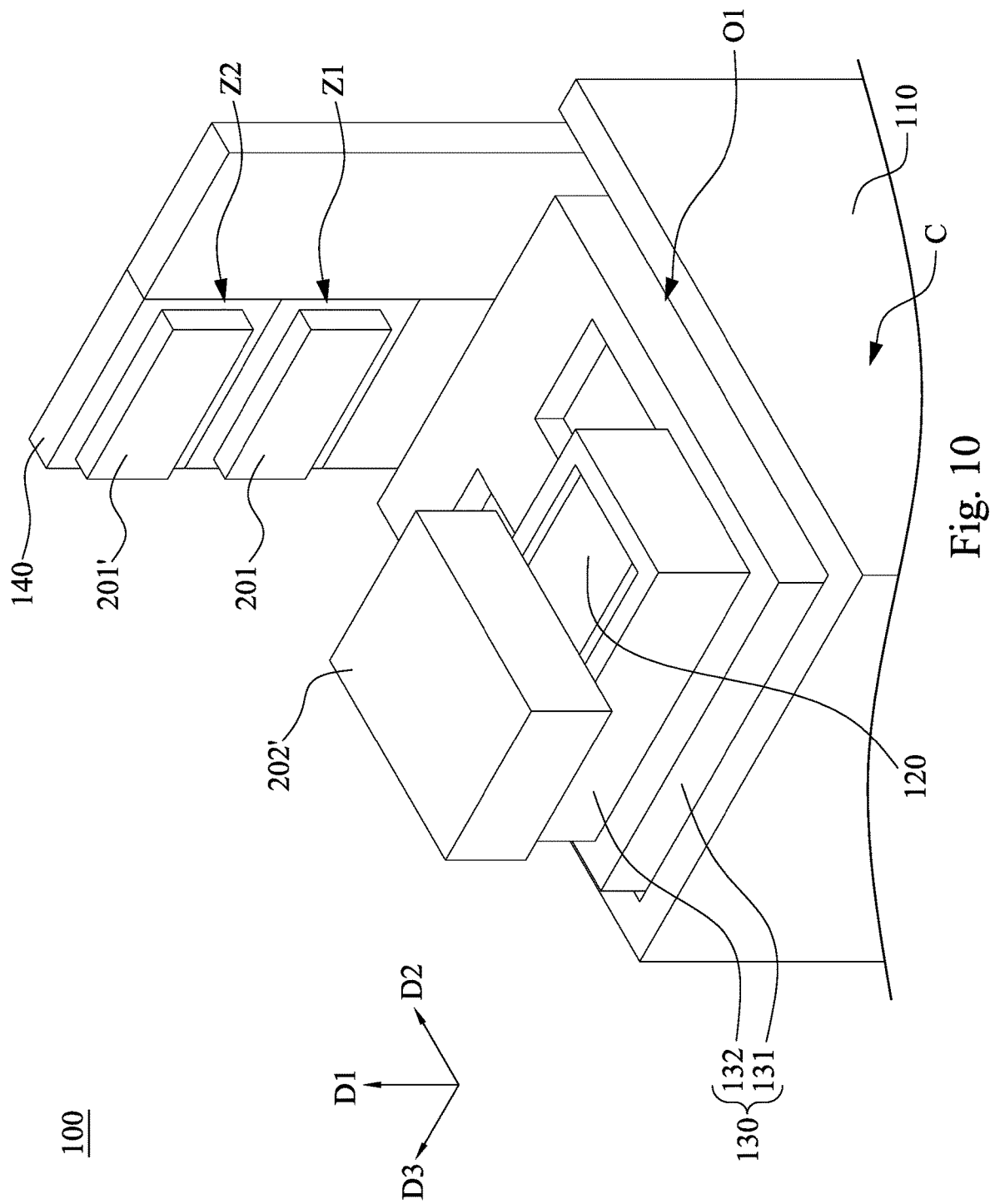
FIG. 10 is a partially magnified view of the wafer carrier handling apparatus of FIG. 1, in which two doors are stored at the door storage device.

Reference is made to FIG. 10. FIG. 10 is a partially magnified view of the wafer carrier handling apparatus 100 of FIG. 1, in which the door 201' and the door 201 are both stored at the door storage device 140. In some embodiments, as shown in FIG. 10, after the door 201' and the wafer carrier 202' are detached from each other, the second base 132 of the moving mechanism 130 is moved away from the door storage device 140 along the second direction D2. As a result, the platform 120 and thus the wafer carrier 202' are moved away from the door storage device 140 along the second direction D2, leaving the door 201' stored at the door storage zone Z2 of the door storage device 140. At this point of time, both of the door storage zones Z1, Z2 are occupied by the door 201 and the door 201' respectively.

Figure 11:
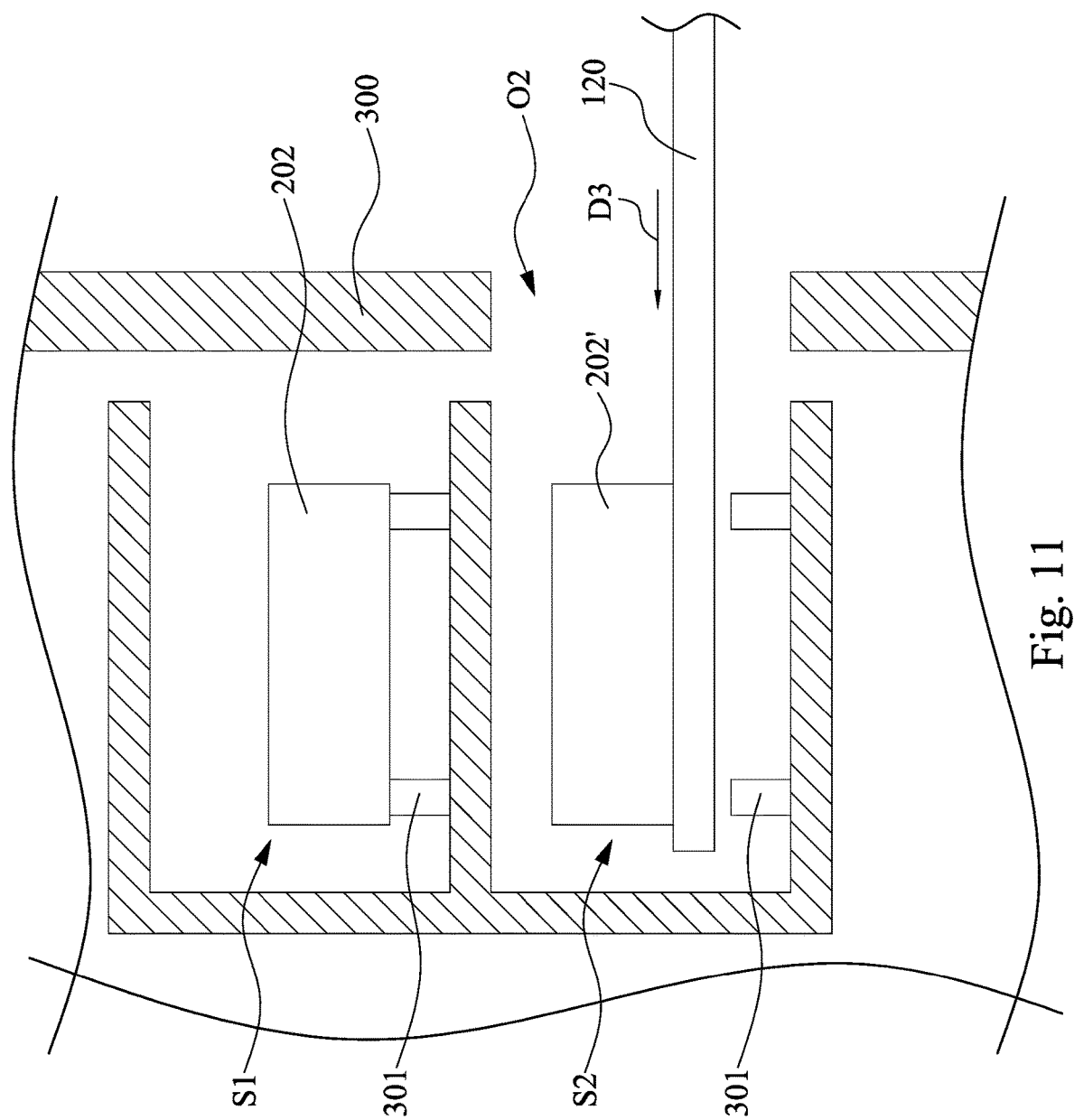
FIG. 11 is a partially magnified cross-sectional view of the wafer carrier handling apparatus of FIG. 1, in which the platform moves the wafer carrier into the processing equipment.

Reference is made to FIG. 11. FIG. 11 is a partially magnified cross-sectional view of the wafer carrier handling apparatus 100 of FIG. 1, in which the platform 120 moves the wafer carrier 202' into the processing equipment 300. In some embodiments, as shown in FIG. 11, after the wafer carrier 202' is moved away with the platform 120 from the door storage device 140 along the second direction D2, the first base 131 is moved vertically along the first direction D1 such that the elevation of the wafer carrier 202' matches the opening O2 of the processing equipment 300. After the elevation of the wafer carrier 202' matches the opening O2 of the processing equipment 300, the moving mechanism 130 moves the platform 120 to load the wafer carrier 202' into the processing equipment 300 through the opening O2.

In some embodiments, the processing equipment 300 has a second accommodation space S2 for accommodating the wafer carrier 202'. The accommodation space S2 is adjacent to the first accommodation space S1. After the first accommodation space S1 is already occupied by the wafer carrier 202, the processing equipment 300 shifts the second accommodation space S2 to replace the first accommodation space S1 such that the second accommodation space S2 is aligned with the opening O2 of the processing equipment 300 and is ready to receive the wafer carrier 202' through the opening O2 along the third direction D3. After the wafer carrier 202' is placed inside the second accommodation space S2, the second base 132 of the moving mechanism 130 moves the platform 120 away from the processing equipment 300 through the opening O2 along the third direction D3, leaving the wafer carrier 202' remaining inside the processing equipment 300.

After the working procedure as described above, the wafer carrier 202' is handled such that the door 201' is stored at the door storage zone Z2 of the door storage device 140 while the wafer carrier 202' is moved into the processing equipment 300. At this point, two of the doors 201, 201' are stored at the door storage device 140 while two of the wafer carriers 202, 202' are accommodated in the processing equipment 300. It is noted that during the procedure when the door 201' is detached from the wafer carrier 202' and stored at the door storage device 140, the door 201 which is already stored at the door storage device 140 is not removed. In this way, the process for successively moving the wafer carriers 202, 202' without the doors 201, 201' into the processing equipment 300 is made smooth, and thus the efficiency of the operation of the wafer carrier handling apparatus 100 is effectively enhanced.

Furthermore, the processor 160 (as shown in FIG. 1) is configured to record a door storage position for each of the doors 201, 201' stored at the door storage zones Z1, Z2. The door storage position of the door 201 can be recorded as the door storage zone Z1, and the door storage position of the door 201' can be recorded as the door storage zone Z2. When the wafer carriers 202, 202' are moved out of the processing equipment 300 and their corresponding doors 201, 201' are to be fixed thereto, the wafer carriers 202, 202' can be aligned with the corresponding door storage zones Z1, Z2 for fixing the corresponding doors 201, 201' to the respective wafer carriers 202, 202'. Note that the doors 201, 201' can be optionally stored at different respective positions. For example, the door 201 can be stored at the door storage zone Z2, and the door 201' can be stored at the door storage zone Z1. In this case, the door storage positions of the doors 201, 201' would then be respectively the door storage zones Z2, Z1.

Figure 12:
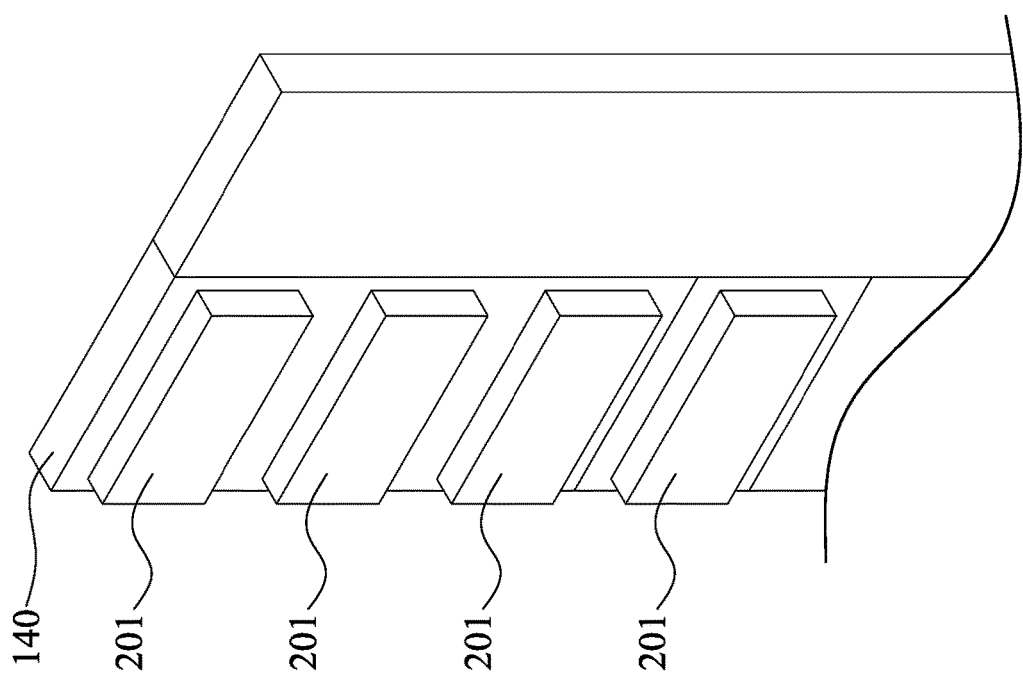
FIG. 12 is a partially magnified view of the wafer carrier handling apparatus in accordance with some embodiments of the present disclosure, in which a plurality of doors are stored at the door storage device.

Reference is made to FIG. 12. FIG. 12 is a partially magnified view of the wafer carrier handling apparatus 100 in accordance with some embodiments of the present disclosure, in which a plurality of doors 201 are stored at the door storage device 140. As mentioned above, the quantity of the doors 201 that the wafer carrier handling apparatus 100 is able to store is plural.

Please return to FIG. 1. As shown in FIG. 1, the wafer carrier handling apparatus 100 further includes a plurality of locking pieces 180 and a plurality of positioning pieces 185. The positioning pieces 185 are preliminarily mounted on a floor. The location of the positioning pieces 185 matches the moving path of the delivery machine 400 mounted above the wafer carrier handling apparatus 100. The locking pieces 180 are connected to the housing 110 and are located on the side of the housing 110 away from the opening O1. The locking pieces 180 are configured to connect the housing to the positioning pieces 185. In some embodiments, the locking pieces 180 are latches suitable for passing through holes formed on the positioning pieces 185. After the locking pieces 180 as latches pass into the holes of the positioning pieces 185, the latches are turned and the relative position between the locking pieces 180 and the positioning pieces 185 is fixed. As a result, the wafer carrier handling apparatus 100 is securely fixed to the floor in a simple and easy manner.

In addition, as shown in FIG. 1, the wafer carrier handling apparatus 100 further includes a plurality of wheels 190. The wheels 190 are disposed outside the housing 110 and on the side of the housing 110 away from the opening O1. In other words, the wheels 190 are disposed under the bottom of the housing 110. With the wheels 190 disposed under the bottom of the housing 110, the wafer carrier handling apparatus 100 can be conveniently moved between different processing equipments 300 according to the actual situations.

The wafer carrier handling apparatus in some embodiments of the present disclosure includes the door storage device which has a plurality of door storage zones. Thus, the quantity of the doors that the wafer carrier handling apparatus is able to store is plural. As a result, the wafer carrier handling apparatus is able to receive a plurality of wafer carriers from the delivery machine one by one and successively move the wafer carriers with the corresponding doors removed into the processing equipment adjacent to the wafer carrier handling apparatus, while no extra work to remove the doors away from the wafer carrier handling apparatus and to store the doors is required throughout the operation. In this way, the process to successively move the wafer carriers without the doors into the processing equipment is made smooth, and thus the efficiency of the operation of the wafer carrier handling apparatus is effectively enhanced. Moreover, since no extra work or hand tool is applied to remove the doors away from the wafer carrier handling apparatus and store the doors at the door storage device throughout the operation, apart from saving man power, the chance of occurrence of human mistakes is also effectively avoided. In addition, a higher degree of a dust free environment in the vicinity is also increased.

According to the some embodiments of the present disclosure, a wafer carrier handling apparatus includes a housing, a platform, a moving mechanism and a door storage device. The platform is configured to hold a wafer carrier. The moving mechanism is connected to the housing and configured to move the platform with respect to the housing. The door storage device is disposed above the housing. The door storage device has a first door storage zone. The first door storage zone is configured to allow a door of the wafer carrier to be held thereon.

According to the some embodiments of the present disclosure, a wafer carrier handling apparatus includes a housing, a platform, a moving mechanism and a transceiver. The platform is configured to hold a first wafer carrier. The moving mechanism is connected to the housing and configured to move the platform to load the first wafer carrier into a processing equipment. The transceiver is disposed on the housing and configured to inform a delivery machine above the platform that the platform is ready to receive a second wafer carrier.

According to the some embodiments of the present disclosure, a method includes detaching a first door from a first wafer carrier and storing the first door at a first door storage zone. The first wafer carrier is moved into a processing equipment after detaching the first door from the first wafer carrier. A second door is detached from a second wafer carrier and is stored at a second door storage zone. The second wafer carrier is moved into the processing equipment after the second door is detached from the second wafer carrier.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A wafer carrier handling apparatus, comprising:
    a housing;
    a wafer carrier supporting platform above the housing;
    a moving mechanism connected between the housing and the wafer carrier supporting platform and configured to move the wafer carrier supporting platform with respect to the housing; and
    a door storage device disposed above the housing, the door storage device comprising a front surface extending upwardly from the housing and facing toward the wafer carrier supporting platform, a first door storage zone within a lower region of the front surface, a second door storage zone within an upper region of the front surface, a first suction head within the first door storage zone, and a second suction head within the second door storage zone and above the first suction head, wherein the first and second suction heads are operative to simultaneously hold doors released from multiple wafer carriers.

2. The wafer carrier handling apparatus of claim 1, wherein the door storage device comprises a first unlocking element within the first door storage zone and configured to release a door from one of the multiple wafer carriers.

3. The wafer carrier handling apparatus of claim 2, wherein the first unlocking element is a male portion.

4. The wafer carrier handling apparatus of claim 2, wherein the door storage device comprises a second unlocking element within the second door storage zone and above the first unlocking element.

5. The wafer carrier handling apparatus of claim 1, wherein the moving mechanism comprises:
    a first base connected to the housing and movable with respect to the housing along a first direction; and
    a second base connected to the first base and movable with respect to the first base along a second direction substantially orthogonal to the first direction, the wafer carrier supporting platform connected to the second base and movable with respect to the second base along a third direction substantially orthogonal to the first direction and the second direction, wherein the second direction is substantially perpendicular to the first door storage zone.

6. The wafer carrier handling apparatus of claim 5, wherein the second base is disposed between the wafer carrier supporting platform and the first base.

7. The wafer carrier handling apparatus of claim 1, further comprising:
    a transceiver disposed on the housing and configured to receive a signal from a delivery machine; and
    a processor electrically connected to the transceiver and the moving mechanism, wherein the processor is configured to control the moving mechanism according to the signal.

8. The wafer carrier handling apparatus of claim 1, further comprising:
    a transceiver disposed on the housing and configured to receive a signal from a delivery machine; and
    a processor configured to record a quantity of frames disposed inside one of the multiple wafer carriers according to the signal.

9. The wafer carrier handling apparatus of claim 1, further comprising:
    an input device disposed on the housing.

10. The wafer carrier handling apparatus of claim 1, wherein a distance between the first and second suction heads is greater than a height of one of the multiple wafer carriers.

11. The wafer carrier handling apparatus of claim 1, wherein the door storage device comprises a male portion-like unlocking element within the second door storage zone and between and vertically aligned with the first and second suction heads.

12. A wafer carrier handling apparatus, comprising:
    a processing equipment having a front wall and an opening on the front wall;
    a housing in front of the opening of the processing equipment;
    a platform above the housing and configured to hold a first wafer carrier;
    a moving mechanism connected between the housing and the platform and configured to move the platform to load the first wafer carrier into the processing equipment through the opening;
    a transceiver disposed on the housing and configured to inform a delivery machine above the platform that the platform is ready to receive a second wafer carrier; and
    a door storage device disposed above the housing and having a plurality of suction heads operative to hold doors released from multiple wafer carriers, wherein the suction heads are arranged on a surface of the door storage device perpendicular to the front wall of the processing equipment.

13. The wafer carrier handling apparatus of claim 12, wherein the moving mechanism has three degrees-of-freedom.

14. The wafer carrier handling apparatus of claim 12, wherein the door storage device has
    a plurality of unlocking elements operative to release the doors from the multiple wafer carriers.

15. The wafer carrier handling apparatus of claim 14, wherein one of the unlocking elements is on an upper region of the surface of the door storage device and between and vertically aligned with corresponding two of the suction heads.

16. The wafer carrier handling apparatus of claim 14, wherein one of the suction heads is on a lower region of the surface of the door storage device and between and vertically aligned with corresponding two of the unlocking elements.

17. The wafer carrier handling apparatus of claim 12, wherein a distance between any two of the suction heads is greater than a height of one of the multiple wafer carriers.

18. A method, comprising:
    detaching a first door from a first wafer carrier and storing the first door at a first door storage zone on a front surface of a door storage device;
    moving the first wafer carrier into a processing equipment along a direction parallel to the front surface of the door storage device after detaching the first door from the first wafer carrier;
    detaching a second door from a second wafer carrier and storing the second door at a second door storage zone; and
    moving the second wafer carrier into the processing equipment after detaching the second door from the second wafer carrier.

19. The method of claim 18, wherein detaching the second door from the second wafer carrier is performed when the first wafer carrier is in the processing equipment.

20. The method of claim 18, wherein moving the first wafer carrier and the second wafer carrier into the processing equipment is performed such that the first wafer carrier and the second wafer carrier are in the processing equipment after moving the first wafer carrier and the second wafer carrier into the processing equipment.

* * * * *